United States Patent
Li et al.

(10) Patent No.: US 11,380,815 B2
(45) Date of Patent: Jul. 5, 2022

(54) SEMICONDUCTOR MATERIAL SUBSTRATE, MICRO LIGHT EMITTING DIODE PANEL AND METHOD OF FABRICATING THE SAME

(71) Applicant: PlayNitride Display Co., Ltd., MiaoLi County (TW)

(72) Inventors: Yun-Li Li, MiaoLi County (TW); Tzu-Yang Lin, MiaoLi County (TW); Ying-Tsang Liu, MiaoLi County (TW); Chih-Ling Wu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 50 days.

(21) Appl. No.: 16/903,390

(22) Filed: Jun. 17, 2020

(65) Prior Publication Data

US 2020/0403116 A1    Dec. 24, 2020

Related U.S. Application Data

(60) Provisional application No. 62/864,517, filed on Jun. 21, 2019.

(30) Foreign Application Priority Data

Oct. 22, 2019  (TW) .................. 108138059

(51) Int. Cl.
*H01L 33/00* (2010.01)
*H01L 33/48* (2010.01)
*H01L 27/15* (2006.01)

(52) U.S. Cl.
CPC ........ *H01L 33/0093* (2020.05); *H01L 27/156* (2013.01); *H01L 33/486* (2013.01)

(58) Field of Classification Search
None
See application file for complete search history.

(56) References Cited

U.S. PATENT DOCUMENTS

2018/0182275 A1   6/2018  Ahmed et al.
2018/0351047 A1  12/2018  Lee et al.

FOREIGN PATENT DOCUMENTS

CN  108198773  6/2018
CN  108597377  9/2018

(Continued)

OTHER PUBLICATIONS

"Office Action of China Counterpart Application", dated Jul. 21, 2021, p. 1-p. 5.

(Continued)

*Primary Examiner* — Robert K Carpenter
(74) *Attorney, Agent, or Firm* — JCIPRNET

(57) ABSTRACT

A method of fabricating a micro light emitting diode (LED) panel is provided. The method includes forming a semiconductor material substrate, forming a plurality of transistor devices, transferring and bonding the transistor devices onto a circuit substrate, and transferring a plurality of micro LED devices from a micro LED device substrate to the circuit substrate. The semiconductor material substrate includes a carrier, a release layer, an inorganic insulation layer, and a semiconductor material layer. The release layer is located between the carrier and the inorganic insulation layer. The semiconductor material layer is bonded to the release layer through the inorganic insulation layer. Electron mobility of the semiconductor material layer is greater than 20 cm$^2$/V·s. The transistor devices are disposed on the release layer and are electrically connected to the circuit substrate. The micro LED devices are electrically connected to the transistor devices. A micro LED panel is also provided.

12 Claims, 8 Drawing Sheets

(56) References Cited

FOREIGN PATENT DOCUMENTS

| | | | |
|---|---|---|---|
| CN | 109728022 | 5/2019 | |
| CN | 109859647 | 6/2019 | |
| TW | 201904073 | 1/2019 | |
| TW | 201933946 | 8/2019 | |
| TW | 201943065 | 11/2019 | |
| WO | WO-2017089676 A1 * | 6/2017 | ......... H01L 21/6835 |

OTHER PUBLICATIONS

"Office Action of Taiwan Counterpart Application", dated Feb. 26, 2021, p. 1-p. 5.

* cited by examiner

SEMICONDUCTOR MATERIAL SUBSTRATE, MICRO LIGHT EMITTING DIODE PANEL AND METHOD OF FABRICATING THE SAME

CROSS-REFERENCE TO RELATED APPLICATION

This application claims the priority benefits of U.S. provisional application Ser. No. 62/864,517, filed on Jun. 21, 2019, and Taiwan application serial no. 108138059, filed on Oct. 22, 2019. The entirety of each of the above-mentioned patent applications is hereby incorporated by reference herein and made a part of this specification.

BACKGROUND

Technical Field

The disclosure relates to a transfer technology of a micro device. More particularly, the disclosure relates to a semiconductor material substrate, a micro light emitting diode panel, and a method of fabricating the same.

Description of Related Art

In recent years, under the circumstance that manufacturing costs and reliability of an Organic Light-Emitting Diode (OLED) display panel cannot match a current mainstream display panel, micro LED displays gradually attract attention of related companies. In addition to advantages of low power consumption and long material life time, a micro LED display also has an excellent optical performance comparable to that of an OLED display, such as high color saturation, fast response speed, and high brightness.

Further, since the display size and resolution gradually increase, the electrical properties, such as electron mobility, of transistor devices are required to be improved. Low temperature poly-silicon thin film transistors (LTPS TFTs) are widely applied to display panels featuring small sizes and high resolutions because the LTPS TFTs exhibit high electron mobility. Nevertheless, the poly-silicon thin film is formed by the excimer laser annealing (ELA) process, it is difficult to control uniformity of the poly-silicon film layer. How to solve the foregoing problem is an important issue in this field.

SUMMARY

The disclosure provides a semiconductor material substrate exhibiting a favorable micro light emitting diode (LED) driving capability.

The disclosure provides a method of fabricating a micro LED panel through which production costs are lowered and design margin is increased.

The disclosure provides a micro LED panel exhibiting both cost advantages and favorable operating electrical properties.

A semiconductor material substrate provided by the disclosure includes a carrier, a release layer, an inorganic insulation layer, and a semiconductor material layer. The release layer is disposed on the carrier. The release layer is located between the carrier and the inorganic insulation layer. The semiconductor material layer is disposed on the inorganic insulation layer. The semiconductor material layer is bonded to the release layer through the inorganic insulation layer. Electron mobility of the semiconductor material layer is greater than 20 $cm^2/V \cdot s$.

In an embodiment of the disclosure, the carrier of the semiconductor material substrate is a sapphire substrate.

In an embodiment of the disclosure, the release layer of the semiconductor material substrate is an epitaxial semiconductor layer, and the inorganic insulation layer is a silicon dioxide layer.

In an embodiment of the disclosure, the semiconductor material layer of the semiconductor material substrate is a single crystalline silicon material layer.

A method of fabricating a micro LED panel provided by the disclosure includes the following steps. A semiconductor material substrate is formed. A plurality of transistor devices are formed. The plurality of transistor devices are transferred and bonded onto a circuit substrate, so that a plurality of micro LED devices are transferred and bonded onto the circuit substrate. The semiconductor material substrate includes a carrier, a release layer, an inorganic insulation layer, and a semiconductor material layer. The release layer is located between the carrier and the inorganic insulation layer. The semiconductor material layer is bonded to the release layer through the inorganic insulation layer. Electron mobility of the semiconductor material layer is greater than 20 $cm^2 N \cdot s$. The plurality of transistor devices are disposed on the release layer. The plurality of transistor devices are electrically connected to the circuit substrate, and the plurality of micro LED devices are electrically connected to the transistor devices.

In an embodiment of the disclosure, in the method of fabricating a micro LED panel, the step of transferring the plurality of transistor devices further includes the following steps. The transistor devices are transferred and bonded onto a temporary substrate, and the transistor devices are transferred and bonded onto the circuit substrate from the temporary substrate.

In an embodiment of the disclosure, in the method of fabricating a micro LED panel, the step of transferring the plurality of transistor devices further includes the following step. The release layer is removed to separate the transistor devices from the carrier.

In an embodiment of the disclosure, in the method of fabricating a micro LED panel, the step of forming the transistor devices further includes the following step. A portion of the semiconductor material layer is removed to form a plurality of semiconductor patterns.

In an embodiment of the disclosure, in the method of fabricating a micro LED panel, the step of forming the transistor devices further includes the following step. A source electrode, a drain electrode, a gate insulation layer, and a gate electrode are formed on each semiconductor pattern. The source electrode and the drain electrode are electrically connected to two different regions of the semiconductor pattern respectively, and the gate insulation layer covers the source electrode, the drain electrode, and a portion of the semiconductor pattern.

In an embodiment of the disclosure, in the method of fabricating a micro LED panel, the source electrode, the drain electrode, and the gate electrode are located between the semiconductor pattern and the circuit substrate after the transistor device is bonded to the circuit substrate.

In an embodiment of the disclosure, in the method of fabricating a micro LED panel, the step of forming the transistor device further includes the following step. A first bump and a second bump are formed. The first bump and the second bump are electrically connected to the source electrode and the drain electrode respectively, and the transistor device is bonded onto the circuit substrate through the first bump and the second bump.

In an embodiment of the disclosure, in the method of fabricating a micro LED panel, the first bump, the second bump, and the gate electrode are formed by patterning a same film layer.

In an embodiment of the disclosure, the method of fabricating a micro LED panel further includes the following steps. A planarization layer is formed to cover the transistor device and the micro LED device, and a conductive layer is formed on the planarization layer. The planarization layer has an opening exposing a top surface of the micro LED device, and the conductive layer is electrically connected to the micro LED device through the opening.

In an embodiment of the disclosure, the method of fabricating a micro LED panel further includes the following step. A plurality of conductive patterns are formed on the circuit substrate after the plurality of transistor devices are transferred to the circuit substrate. A part of the conductive patterns are electrically connected to the plurality of transistor devices respectively. The plurality of micro LED devices are bonded and electrically connected to another part of the conductive patterns respectively.

In an embodiment of the disclosure, in the method of fabricating a micro LED panel, the step of forming the transistor device further includes the following step. A portion of the inorganic insulation layer is removed to form an insulation pattern. The insulation pattern overlaps the transistor device.

In an embodiment of the disclosure, the method of fabricating a micro LED panel, the transistor device is located between the circuit substrate and the insulation pattern after the transistor device is transferred and bonded to the circuit substrate.

A micro LED panel provided by the disclosure includes a circuit substrate, a plurality of transistor devices, and a plurality of micro LED panels. The plurality of transistor devices are bonded to the circuit substrate, and each of the transistor devices has a semiconductor pattern, a source electrode, a drain electrode, and a gate electrode. The source electrode and the drain electrode are electrically connected to the semiconductor pattern, and the source electrode, the drain electrode, and the gate electrode are located between the semiconductor pattern and the circuit substrate. Electron mobility of the semiconductor pattern is greater than 20 $cm^2/V \cdot s$. A plurality of micro LED devices are bonded to the circuit substrate and are electrically connected to the plurality of transistor devices respectively.

In an embodiment of the disclosure, the circuit substrate of the micro LED panel further includes a plurality of bumps for electrically connecting the transistor devices and the micro light emitting diode devices to the circuit substrate.

In an embodiment of the disclosure, the circuit substrate of the micro LED panel has a plurality of signal lines, and the signal lines are electrically connected to the gate electrodes and the source electrodes of the transistor devices and the micro LED devices respectively.

In an embodiment of the disclosure, the micro LED panel further includes the planarization layer and the conductive layer. The planarization layer is disposed on the circuit substrate and covers the plurality of transistor devices and the plurality of micro LED devices. The conductive layer covers the planarization layer, and planarization layer has a plurality of openings overlapping the micro LED devices. The conductive layer extends into the openings to be electrically connected to the plurality of micro LED devices.

To sum up, in the micro LED panel and the method of fabricating the same provided in an embodiment of the disclosure, the plurality of transistor devices pre-formed on the carrier are transferred and bonded onto the circuit substrate through the transfer process in order to improve production costs and design margin. In another view, the electron property of the transferring transistor devices is better than traditional TFT device, the micro LED panel exhibits better image performance.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
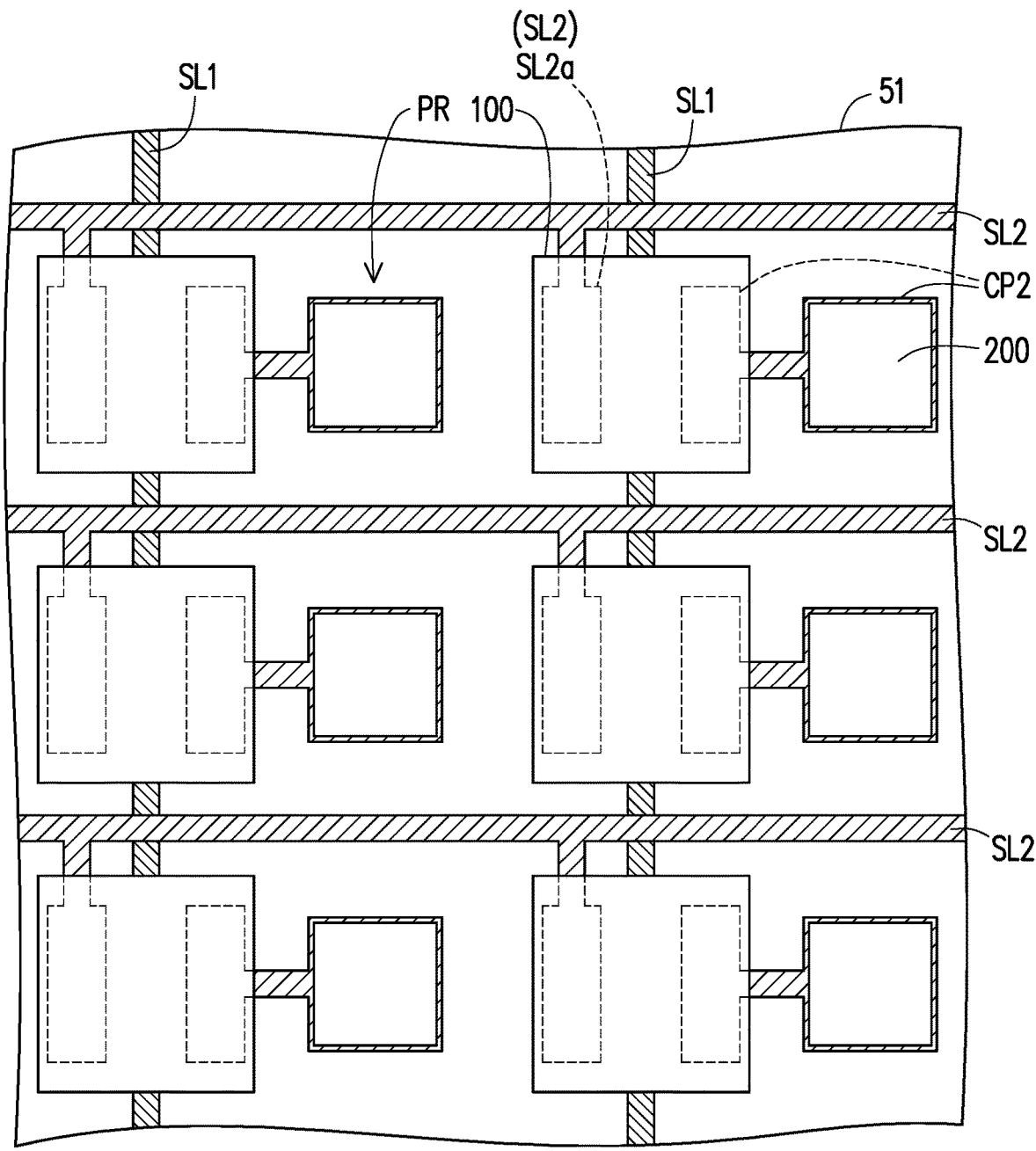
FIG. 1 is a schematic top view of a micro light emitting diode (LED) panel according to an embodiment of the disclosure.

In the accompanying drawings, thicknesses of layers, films, panels, regions and so on are exaggerated for clarity. It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected. Therefore, the electrical connection between two devices may include intervening elements existing between the two devices.

Descriptions of the disclosure are given with reference to the exemplary embodiments illustrated by the accompanying drawings. Wherever possible, the same reference numbers are used in the drawings and the description to refer to the same or like parts.

Figure 2A:
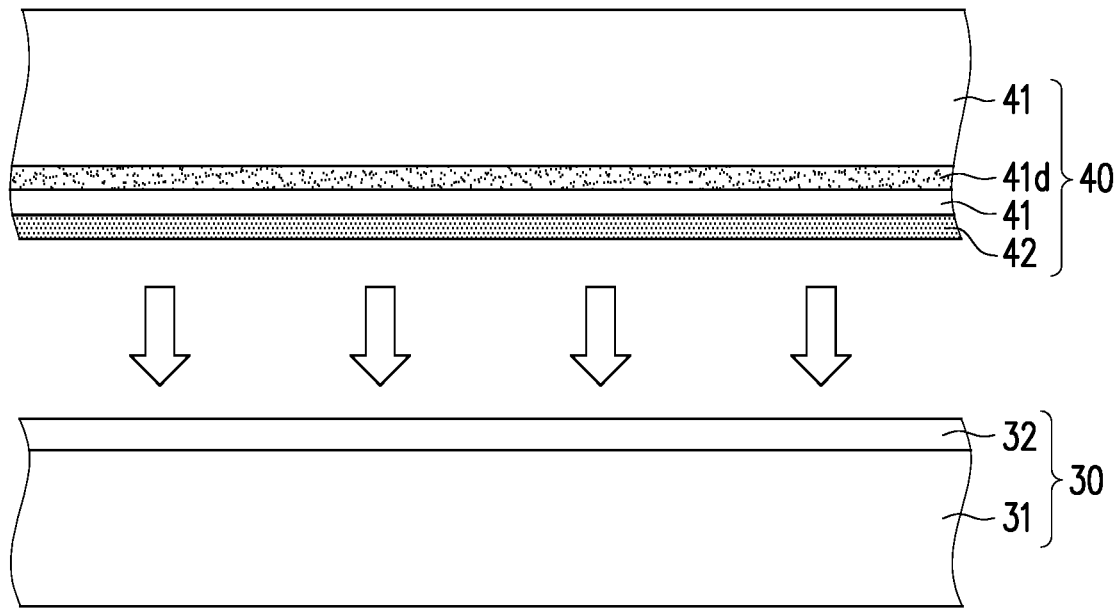
FIG. 2A to FIG. 2K are cross-sectional views of a process of fabricating the micro LED panel of FIG. 1.
Figure 2B:
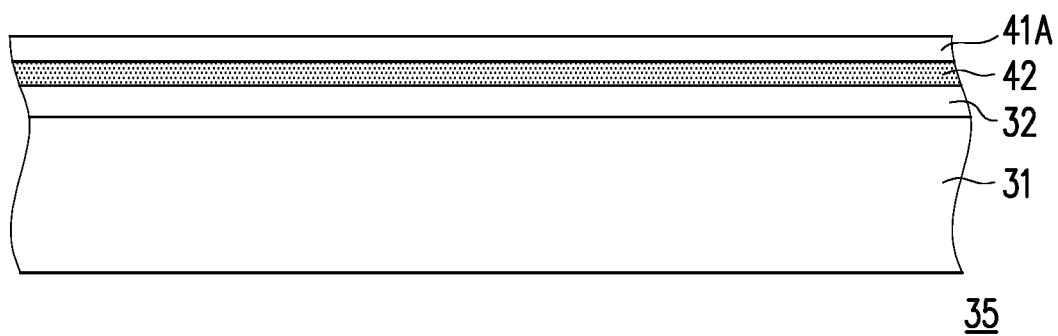

FIG. 1 is a schematic top view of a micro light emitting diode (LED) panel according to an embodiment of the disclosure. FIG. 2A to FIG. 2K are cross-sectional views of a process of fabricating the micro LED panel of FIG. 1. FIG. 3 is a cross-sectional view of a local portion of the micro LED panel of FIG. 1. Note that an insulation layer 55, a bump P3, a planarization layer PL, and a conductive layer CL of FIG. 3 are omitted in FIG. 1 so that FIG. 1 may be clearly presented.

With reference to FIG. 1 and FIG. 3, a micro LED panel 10 includes a circuit substrate 50, a plurality of transistor devices 100, and a plurality of micro LED devices 200. The transistor devices 100 and the micro LED devices 200 are bonded on the circuit substrate 50 and are electrically connected to the circuit substrate 50 respectively. The circuit substrate 50 may include a substrate 51 and a plurality of signal lines disposed on the substrate 51. In this embodiment, the plurality of signal lines include a plurality of first signal lines SL1 and a plurality of second signal lines SL2. The first signal lines SL1 and the second signal lines SL2 intersecting each other may define a plurality of pixel regions PR of the micro LED panel 10. The plurality of micro LED devices 200 are respectively disposed in the pixel regions PR. In other words, each pixel region PR has one micro LED device 200 in this embodiment, but the disclosure is not limited to the content disclosed by the drawings. In other embodiment, a number of the micro LED devices 200 disposed in the pixel regions PR may be more than two for actual application.

For instance, the first signal lines SL1 and the second signal lines SL2 respectively are scan lines and power lines, but the disclosure is not limited thereto. Note that in this embodiment, one micro LED device 200 corresponds to one transistor device 100 for exemplary illustration purposes, but the disclosure is not limited thereto. In other embodiments, a number of the transistor devices 100 configured to drive the micro LED devices 200 may be more than two or three for actual circuit design, or each transistor device 100 includes a plurality of electron components (e.g., multiple transistors and passive components). Moreover, the circuit substrate 50 may also include a plurality of third signal lines, for example, sensing lines or data lines. In this embodiment, the circuit substrate 50 may include a plurality of conductive patterns CP, and the conductive patterns CP are electrically connected between the transistor devices 100 and the micro LED devices 200.

Moreover, each of the transistor devices 100 has a source electrode SE, a drain electrode DE, a gate electrode GE, and a semiconductor pattern SC. Herein, the source electrode SE is electrically connected between the semiconductor pattern SC and a pad portion SL2a of the second signal line SL2. The drain electrode DE is electrically connected between the semiconductor pattern SC and the corresponding conductive pattern CP, and the gate electrode GE is electrically connected to the first signal line SL1. In particular, the source electrode SE, the drain electrode DE, and the gate electrode GE may be located between the semiconductor pattern SC and the circuit substrate 50, but the disclosure is not limited thereto. In this embodiment, each transistor device 100 may also include a bump P1, a bump P2, and a bump P3 optionally. The bump P1 and the bump P2 penetrate a gate insulation layer 105 of the transistor device 100, so as to be electrically connected to the source electrode SE and the drain electrode DE respectively. The bump P3 may penetrates the insulation layer 55 to be electrically connected to the first signal line SL1. To be specific, the transistor devices 100 are bonded and electrical connected onto the circuit substrate 50 through the bumps P1, the bumps P2, the bumps P3. Furthermore, the bump P1 directly contacts the source electrode SE and the pad portion SL2a, the bump P2 directly contacts the drain electrode DE and the conductive pattern CP, and the bump P3 directly contacts the gate electrode GE and the first signal line SL1, but the disclosure is not limited thereto.

In this embodiment, a material of the semiconductor patterns SC may be a single crystalline silicon. In this way, the transistor devices 100 may feature high electron mobility. For instance, the transistor devices 100 may have electron mobility greater than 100 cm$^2$N·s, so that electrical properties of the micro LED panel 10 are improved. Nevertheless, the disclosure is not limited thereto. According to other embodiments, the material of the semiconductor patterns SC may also include low temperature poly-silicon (LTPS) or metal oxide (e.g., Indium Gallium Zinc Oxide, IGZO). That is, the transistor device may be a low-temperature poly-silicon thin film transistor (LTPS TFT), a micro-Si TFT, or a metal oxide transistor. To be more specific, in an embodiment, electron mobility of a transistor device including metal oxide may be greater than 20 cm$^2$/V·s. In another embodiment, electron mobility of a transistor device including low-temperature poly-silicon may be greater than 50 cm$^2$N·s.

The micro LED device 200 includes an epitaxial structure 210, a first electrode 201, and a second electrode 202. In this embodiment, the first electrode 201 and the second electrode 202 are respectively disposed at two opposite sides of the epitaxial structure 210. That is, the micro LED device 200 of this embodiment is a vertical type micro light emitting device, but the disclosure is not limited thereto. Further, the epitaxial structure 210 may include a first type semiconductor layer 211, a light emitting layer, 212, and a second type semiconductor layer 213. The first electrode 201 and the second electrode 202 are electrically connected to the first type semiconductor layer 211 and the second type semiconductor layer 213 respectively. In this embodiment, the first type semiconductor layer 211 and the second type semiconductor layer 213 may respectively be a P type semiconductor layer and an N type semiconductor layer, and the light emitting layer 212 may have a multiple quantum well (MQW) structure, but the disclosure is not limited thereto.

For instance, in this embodiment, the thickness of the first type semiconductor layer 211 is different from the thickness of the second type semiconductor layer 213 in a normal direction. In this embodiment, the thickness of the second type semiconductor layer 213 is thicker than the thickness of the first type semiconductor layer 211. That is, the light emitting layer 212 of the micro LED device 200 may be located closer to the first electrode 201 (as shown in FIG. 3), but the disclosure is not limited thereto.

In this embodiment, the micro LED panel 10 further includes the planarization layer PL and the conductive layer CL. The planarization layer PL covers the transistor devices 100, the micro LED devices 200, and a portion of the circuit substrate 50 and has a plurality of openings PLa overlapping the plurality of micro LED devices 200. The conductive layer CL covers the planarization layer PL and extends into these openings PLa to form the second electrodes 202 electrically connected to the plurality of micro LED devices 200. In other words, the second electrodes 202 of this embodiment connect each other and form as the conductive layer as a common electrode. For instance, the first electrode 201 may have a high electric potential, the second electrode 202 (or the conductive layer CL) may have a low electric potential (or a ground potential). Moreover, the light emitting layer 212 of the epitaxial structure 210 is enabled to emit a (visible) light beam by controlling the voltage bias between the first electrode 201 and the second electrode 202, so that an image display is achieved.

Description of an exemplary process of fabricating the micro LED panel 10 is provided as follows. With reference to FIG. 2A and FIG. 2B, first, a semiconductor material substrate 35 is formed. In this embodiment, the semiconductor material substrate 35 includes a carrier 31, a release layer 32, an inorganic insulation layer 42, and a semiconductor material layer 41A. The release layer 32 is located between the carrier 31 and the inorganic insulation layer 42, and the inorganic insulation layer 42 is located between the release layer 32 and the semiconductor material layer 41A.

For instance, the semiconductor material substrate 35 is formed by bonding a silicon wafer 40 onto an epitaxial substrate 30.

To be specific, the epitaxial substrate 30 includes the carrier 31 and the release layer 32 disposed on the carrier 31. The silicon wafer 40 includes, for example, a single crystalline silicon material layer 41, a hydrogen-doped crystalline silicon material layer 41d, and the inorganic insulation layer 42. That is, the silicon wafer 40 may comprise a multilayer stack structure formed by the plurality of layers of the semiconductor material and the inorganic insulation material. In particular, the distributing position of the hydrogen-doped crystalline silicon material layer 41d may be controlled in the single crystalline silicon material layer 41 to define the thickness of the single crystalline silicon material layer 41 between the inorganic insulation layer 42 and the hydrogen-doped crystalline silicon material layer 41d. In other words, a single crystalline silicon thin film may be formed on a portion of the single crystalline silicon material layer 41 located between the hydrogen-doped crystalline silicon material layer 41d and the inorganic insulation layer 42.

Further, the silicon wafer 40 is directly connected to the epitaxial substrate 30 through a bonding process to make the inorganic insulation layer 42 adhere to the release layer 32. After the silicon wafer 40 and the epitaxial substrate 30 are bonded, a high temperature process may be performed, so that the hydrogen-doped crystalline silicon material layer 41d blisters and may be peeled off, and that two portions of the single crystalline silicon material layer 41 located at two opposite sides of the hydrogen-doped crystalline silicon material layer 41d are separated from each other. Next, a chemical mechanical polishing (CMP) process may further be performed to the single crystalline silicon material layer 41 disposed on the carrier 31 to form the semiconductor material layer 41A of the semiconductor material substrate 35. To be more specifically, a thickness of the semiconductor material layer 41A may be controlled by a depth location of the hydrogen-doped crystalline silicon material layer 41d in the single crystalline silicon material layer 41 of the silicon wafer 40 initially, and adjusted more precisely by CMP process. Nevertheless, the disclosure is not limited thereto. According to other embodiments, the semiconductor material layer of the semiconductor material substrate may be formed on the epitaxial substrate through an epitaxial film forming manner.

In this embodiment, the carrier 31 is, for example, a sapphire substrate, a glass substrate, a silicon wafer substrate, a silicon carbide substrate, or a polymer film, but the disclosure is not limited thereto. In this embodiment, a material of the release layer 32 may include gallium nitride (GaN), silicon oxide, or silicon nitride. A material of the inorganic insulation layer 42 includes silicon oxide ($SiO_2$), silicon nitride ($SiN_x$), silicon oxynitride ($SiO_xN_y$; x>y), silicon oxynitride ($SiN_xO_y$; x>y), or other suitable inorganic insulation materials.

Figure 2C:
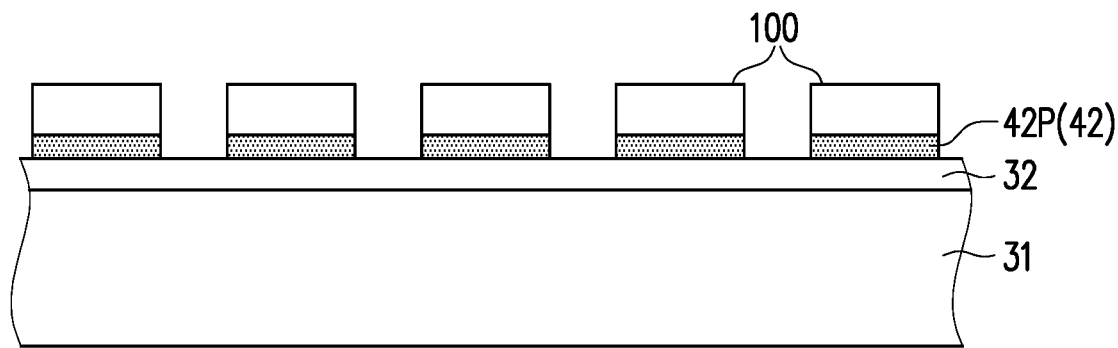
Figure 2D:
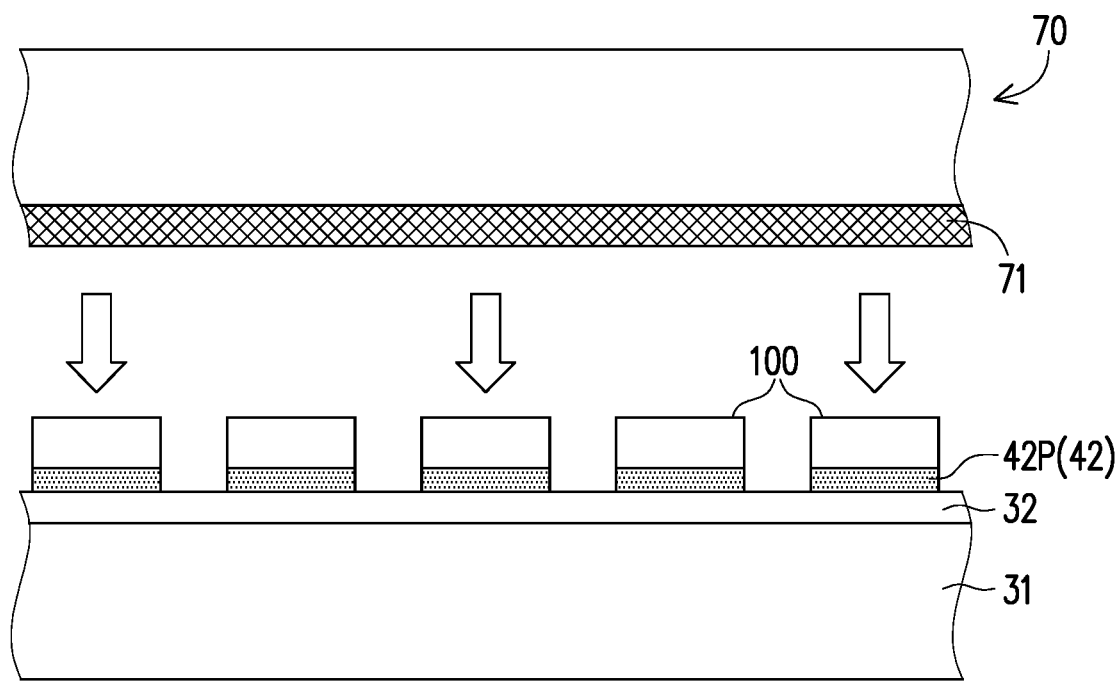
Figure 2E:
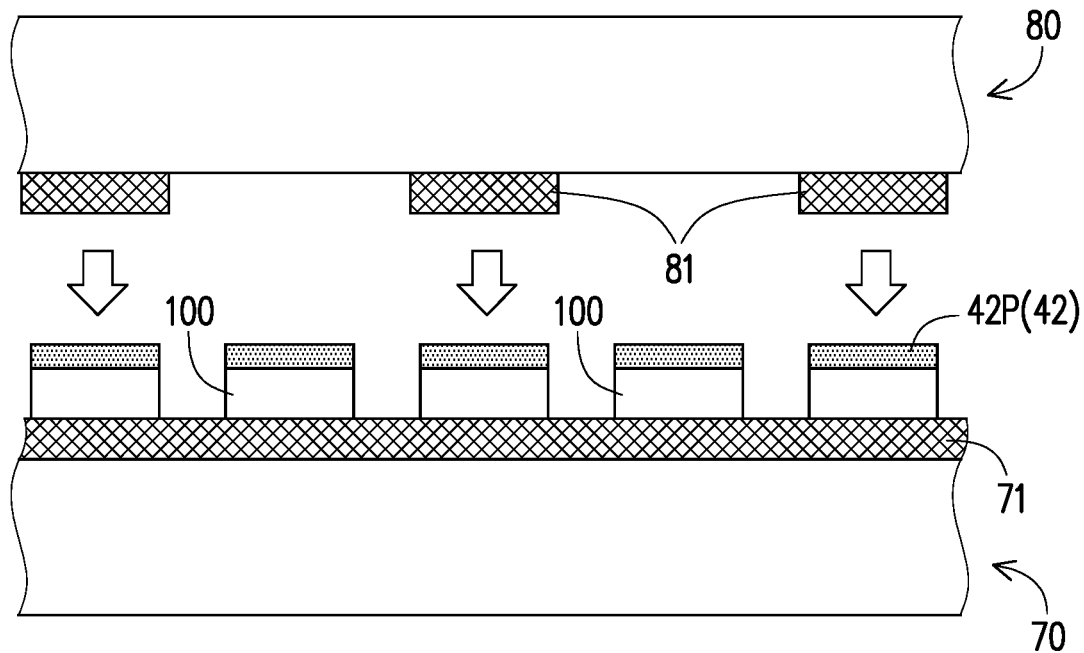
Figure 2F:
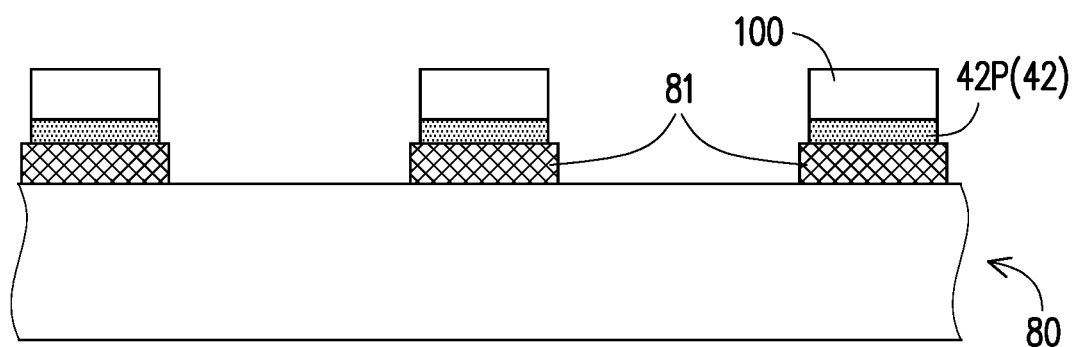
Figure 2G:
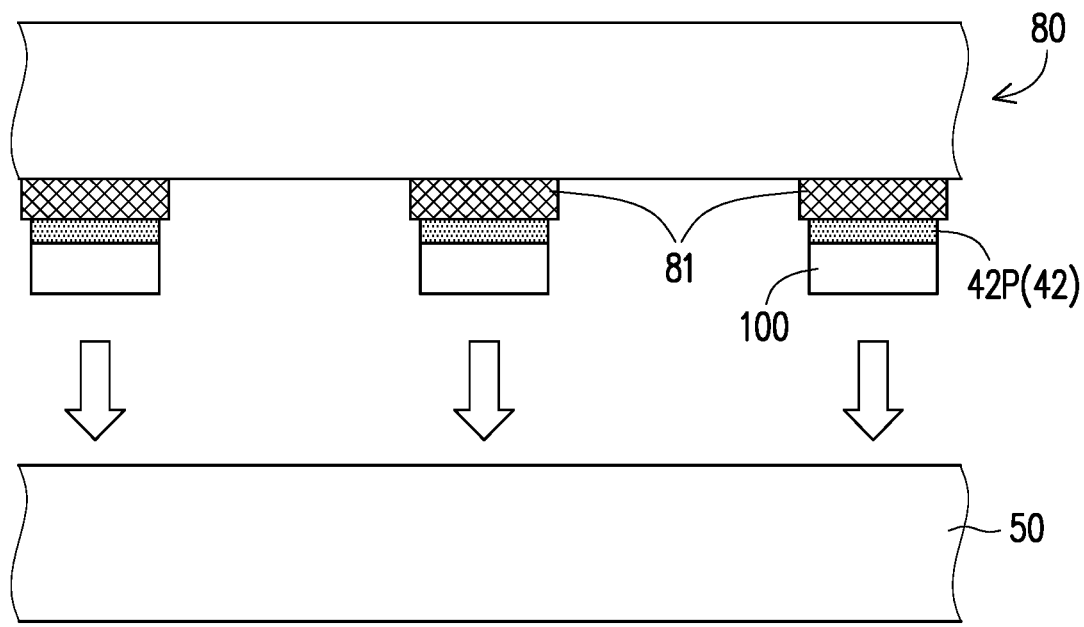
Figure 2H:
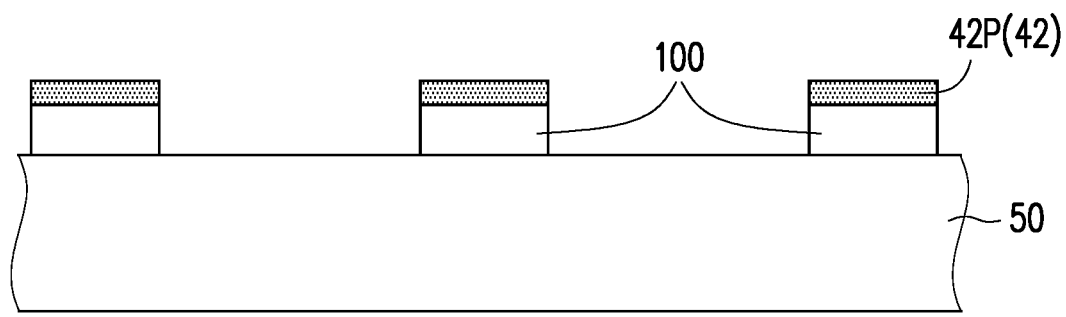
Figure 3:
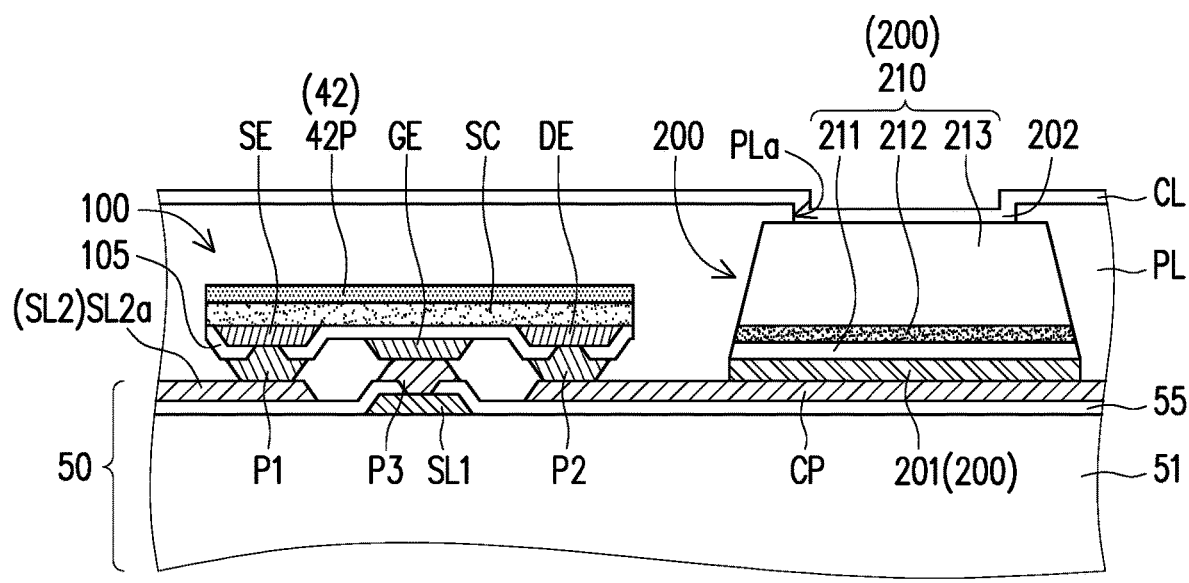
FIG. 3 is a cross-sectional view of a local portion of the micro LED panel of FIG. 1.

Next, a plurality of transistor devices 100 are formed on the semiconductor material substrate 35, as shown in FIG. 2C. With reference to FIG. 2B, FIG. 2C, and FIG. 3 together, for instance, the step of forming the transistor device 100 may include patterning the semiconductor material layer 41A and the inorganic insulation layer 42 to form a plurality of semiconductor patterns SC and a plurality of insulation patterns 42P, forming the source electrode SE and the drain electrode DE, forming the gate insulation layer 105, and forming the gate electrode GE. Considering electrical conductivity, metal materials are generally used as materials of the source electrode SE, the drain electrode DE, and the gate electrode GE. Nevertheless, the disclosure is not limited thereto. According to other embodiments, other conductive material may also be used for the source electrode SE, the drain electrode DE, and the gate electrode GE, such as alloy, metal nitride, metal oxide, metal oxynitride, or other suitable materials or a stack layer of a metal material and other conductive materials.

In this embodiment, the insulation patterns 42P and the semiconductor patterns SC are formed in a same photolithography and etching process, the shape of the insulation patterns 42P are similar to the shape of the semiconductor patterns SC. That is, the insulation patterns 42P may completely overlap the semiconductor patterns SC. Nevertheless, the disclosure is not limited thereto. According to other embodiments, the photolithography and etching process may be performed to the inorganic insulation layer 42 and the gate insulation layer 105 at the same time, so that a plurality of insulation patterns are formed. Further, the step of forming the transistor device 100 may further include forming a plurality of bumps, such as the bump P1 and the bump P2. The bump P1 and the bump P2 extend to the openings of the gate insulation layer 105 to be electrically connected to the source electrode SE and the drain electrode DE, respectively. Nevertheless, the disclosure is not limited thereto, and the bumps may also be fabricated in a following transfer process. In this embodiment, materials of the bump P1, the bump P2 are indium, and materials of the source electrode SE, the drain electrode DE and the gate electrode GE may be Wu, Mo, Ti, Cu or Ag, but the disclosure is not limited thereto.

With reference to FIG. 2D to FIG. 2H, after the transistor devices 100 are formed, these transistor devices 100 may be transferred from the carrier 31 to a temporary substrate, and these transistor devices 100 are then selectively transferred and bonded to the circuit substrate 50, but the disclosure is not limited thereto. In other embodiments, the transistor devices 100 may also be directly transferred to the circuit substrate 50. In this embodiment, the transistor devices 100 are transposed onto the circuit substrate 50 through two transfer processes.

To be specific, in a first transfer process of the transistor devices 100, the transistor devices 100 are temporarily fixed to a carrier structure 70 by through an adhesion layer 71. Next, the transistor devices 100 on the carrier structure 70 are picked up selectively by at least one transfer portions 81 of a carrier structure 80. Further, the transistor devices 100 are fixed onto the carrier structure 80 owing to an adhesion relation between the insulation patterns 42P and the transfer portions 81. And then, the carrier structure 80 places the transistor devices 100 onto the circuit substrate 50. Further, the pitch between the transistor devices 100 disposed on the carrier 31 is different from the manner between the transistor devices 100 on the circuit substrate 50. In this embodiment, the insulation patterns 42P are disposed on the side surfaces of the transistor devices 100 opposite to the circuit substrate 50, but the disclosure is not limited thereto. Note that in each of the transistor devices 100, since the insulation pattern 42P is disposed at one side surface of the transistor device 100 away from the circuit substrate 50, in the following process, there's no need to form an additional insulation layer configured to prevent electrical shorting between other conductive film layers and the transistor device 100. In this way, production costs are thereby lowered.

For instance, a material of the adhesion layer 71 may include an adhesive material. The adhesive material is, for example, an organic material (e.g., benzocyclobutene, phenol formaldehyde resin, epoxy resin, polyisoprene rubber, or a combination thereof), an inorganic material (e.g., silicon oxide, silicon nitride, silicon oxynitride, or a combination thereof), or a thermal alteration material (e.g., a cold brittle material, a hot-melt material, a photoresist material, or a combination thereof). In particular, adhesiveness of the adhesive material may change along with temperature changes. For instance, when the temperature increases, the adhesive material may provide greater adhesiveness, but the disclosure is not limited thereto. In other words, the transistor devices 100 may be transferred through an adhesion force between the adhesion layer 71 and the transistor devices 100, but the disclosure is not limited thereto. In other embodiments, transferring manners used by the transposing technology of the micro devices may also include an electrostatic force manner, a Van Der Waals force manner, a fluid, a magnetic force, etc. In addition, in this embodiment, the adhesion layer 71 is formed on the carrier structure 70 as a whole film layer without patterns, so that all of the transistor devices 100 on the carrier 31 are transferred onto the carrier structure 70, but the disclosure is not limited thereto. In other embodiments, the adhesion layer 71 may also be a patterned film layer, so as to selectively pick up the transistor devices 100 on the carrier 31.

In particular, after the adhesion layer 71 of the carrier structure 70 are adhered to the plurality of transistor devices 100, the release layer 32 may be removed, so that the transistor devices 100 are separated from the carrier 31. For instance, the release layer 32 may be removed through a laser lift off (LLO) process, but the disclosure is not limited thereto. In other embodiments, a supporting structure may be formed on the carrier 31, and such supporting structure is adapted to temporarily fix the plurality of transistor devices 100 onto the carrier 31. In a transferring process after the transistor devices are adhered to the carrier structure 70, this supporting structure may be easily broken, so that the transistor devices are separated from the carrier 31.

Figure 2I:
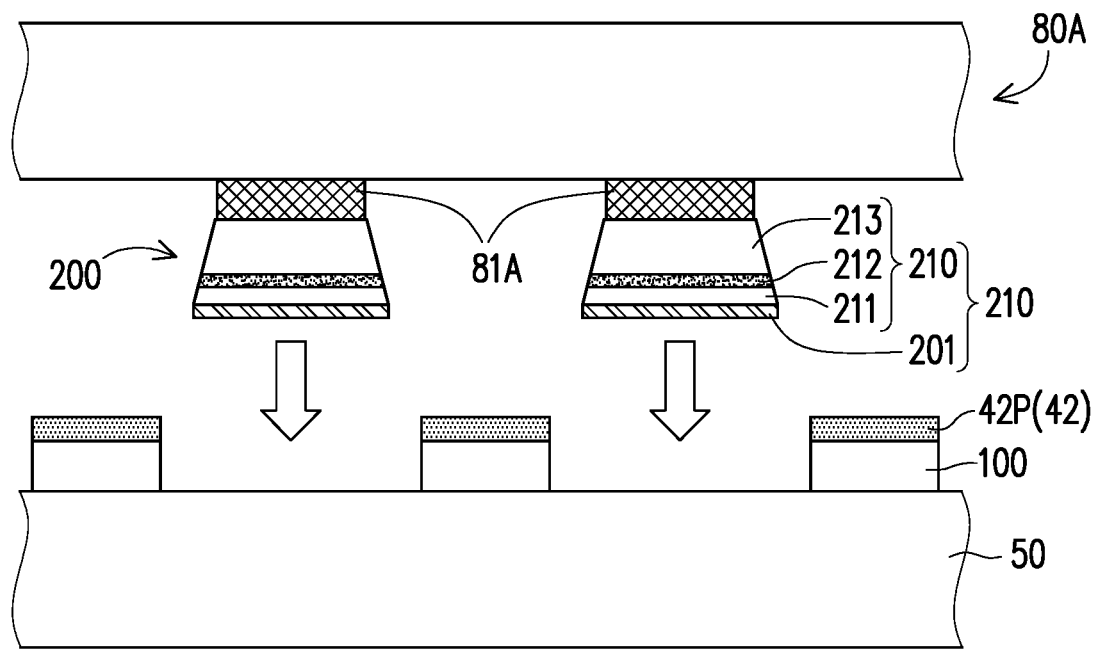
Figure 2J:
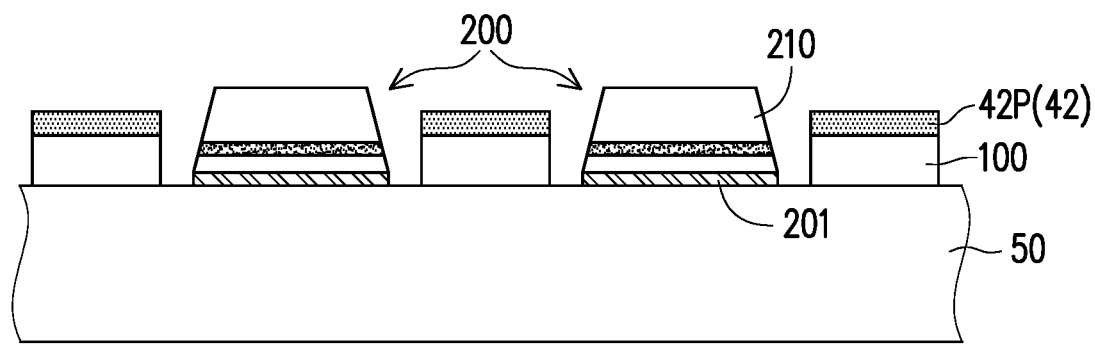

With reference to FIG. 1, FIG. 2I, and FIG. 2J, after the plurality of transistor devices 100 are transferred and bonded to the circuit substrate 50, the plurality of micro LED devices 200 are transferred onto the circuit substrate 50 from a source wafer of micro LED device (not shown). For instance, the micro LED devices 200 may be transposed to the circuit substrate 50 and arranged between two adjacent transistor devices 100 on the circuit substrate 50 through transfer portions 81A of a transfer head 80A. In other words, the plurality of transistor devices 100 and the plurality of micro LED devices 200 may be arranged on the circuit substrate 50 in an alternating manner in an extending direction of the second signal lines SL2, but the disclosure is not limited thereto. In other embodiments, two or more micro LED devices 200 may be disposed between two adjacent transistor devices 100. Note that an arrangement of the plurality of transfer portions 81A on the transfer head 80A is not limited. In other embodiments, the arrangement (e.g., pattern or pitch) of the plurality of transfer portions 81A of the transfer head 80A may be adjusted according to actual product design and manufacturing process needs.

The plurality of transistor devices 100 pre-formed on the carrier 31 are transferred onto the circuit substrate 50 through the transfer process, and in this way, production costs are lowered, and process margin is better. Furthermore, the semiconductor pattern SC of the transistor device 100 of this embodiment is using single crystalline silicon thin film material. Accordingly, the transistor devices 100 may exhibit more favorable electron mobility than an amorphous silicon semiconductor material or a metal oxide semiconductor material. Moreover, through the mass transfer process, this single crystalline silicon transistors exhibiting favorable electron mobility may be applied to large-sized display panels, so that electrical properties of the large-sized display panels are improved.

Figure 2K:
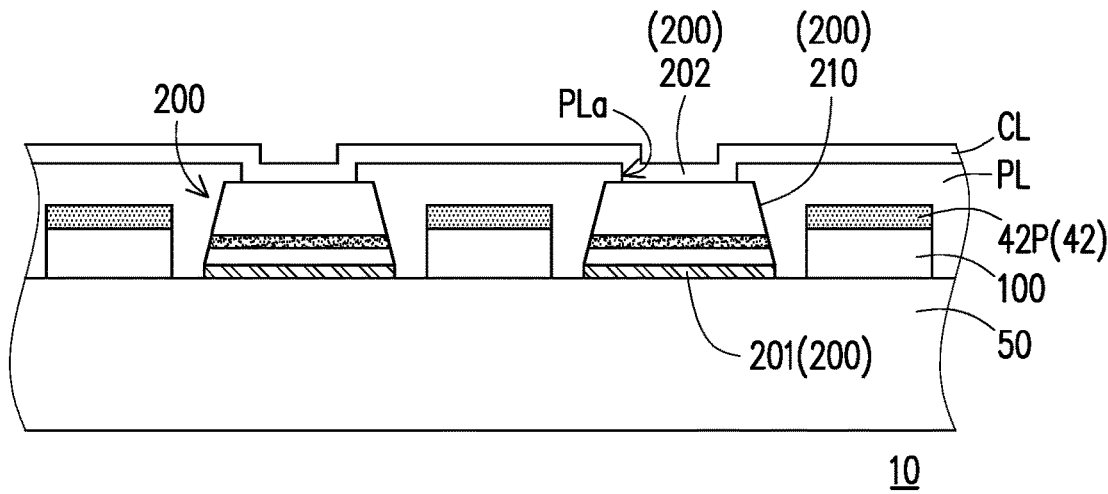

With reference to FIG. 2K, after the plurality of micro LED devices 200 are transposed onto the circuit substrate 50, the planarization layer PL is formed to cover the transistor devices 100 and the micro LED devices 200. The planarization layer PL has a plurality of openings PLa overlapping the plurality of micro LED devices 200. In this embodiment, a material of the planarization layer PL may include an inorganic material (e.g., silicon oxide, silicon nitride, silicon oxynitride, other suitable materials, or a stack layer of at least two of the above materials), an organic material, or other suitable materials or a combination thereof. Next, the conductive layer CL is formed on the planarization layer PL. The conductive layer CL covers the planarization layer PL and extends into the openings PLa of the planarization layer PL to be electrically connected to the plurality of micro LED devices 200. Herein, the micro LED panel 10 of this embodiment is completed.

Note that in the flow process of fabricating the micro LED panel 10 of this embodiment, the transistor devices 100 and the micro LED devices 200 are exemplified as the members adopting the transfer technology for exemplary illustration purposes, but the disclosure is not limited thereto. According to other embodiments that are not shown, the micro LED panel may further include a micro integrated circuit, a micro sensor, a microchip having a circuit, or other micro-semiconductor components capable of controlling execution of a predetermined electronic function, and these micro devices may also be transferred through the foregoing transposing manner.

Figure 4:
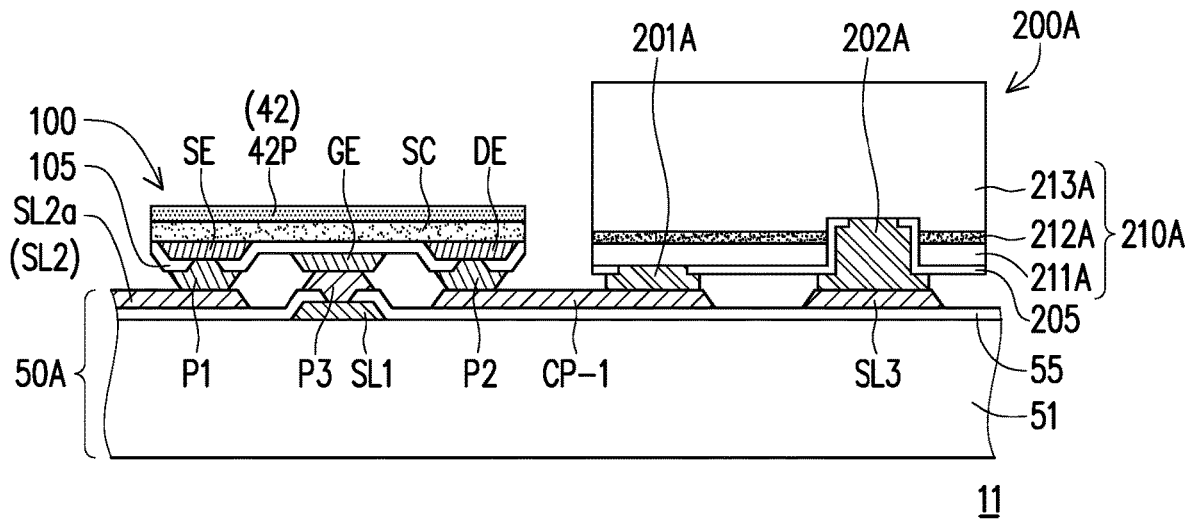
FIG. 4 is a cross-sectional view of a micro LED panel according to another embodiment of the disclosure.

FIG. 4 is a cross-sectional view of a micro LED panel according to another embodiment of the disclosure. With reference to FIG. 4, a difference between a micro LED panel 11 of this embodiment and the micro LED panel 10 of FIG. 3 includes that the micro LED devices are flip-chip type and the circuit layout design. In this embodiment, a first electrode 201A and a second electrode 202A of a micro LED device 200a are disposed at a same side of an epitaxial structure 210A. That is, the micro LED device 200A is a flip-chip type micro LED device. Specifically, the micro LED device 200A further includes an insulation layer 205. The first electrode 201A penetrates the insulation layer 205 to be electrically connected a first type semiconductor layer 211A. There is a via hole penetrating the first type semiconductor layer 211A and a light emitting layer 212A to expose a partial of a second type semiconductor layer 213A. The insulation layer 205 extends to the via hole and has an opening in the via hole, as well as the second electrode 202A is formed in the via hole and electrically connects and contacts to the second type semiconductor layer 213A.

A circuit substrate 50A further includes a third signal line SL3, and the first electrode 201A and the second electrode 202A of the micro LED device 200A are respectively bonded to a conductive pattern CP-1 of the circuit substrate 50A and the third signal line SL3. For instance, when the micro LED panel 11 is enabled, the third signal line SL3 may have a ground potential or a low electric potential. In this embodiment, since the two electrodes of the micro LED device 200A are located at the same side of the epitaxial structure 210A, after the micro LED device 200A is transferred and bonded onto the circuit substrate 50A, fabrication of a planarization layer and a conductive layer may be omitted in the flowing process, so that production costs are reduced.

Figure 5:
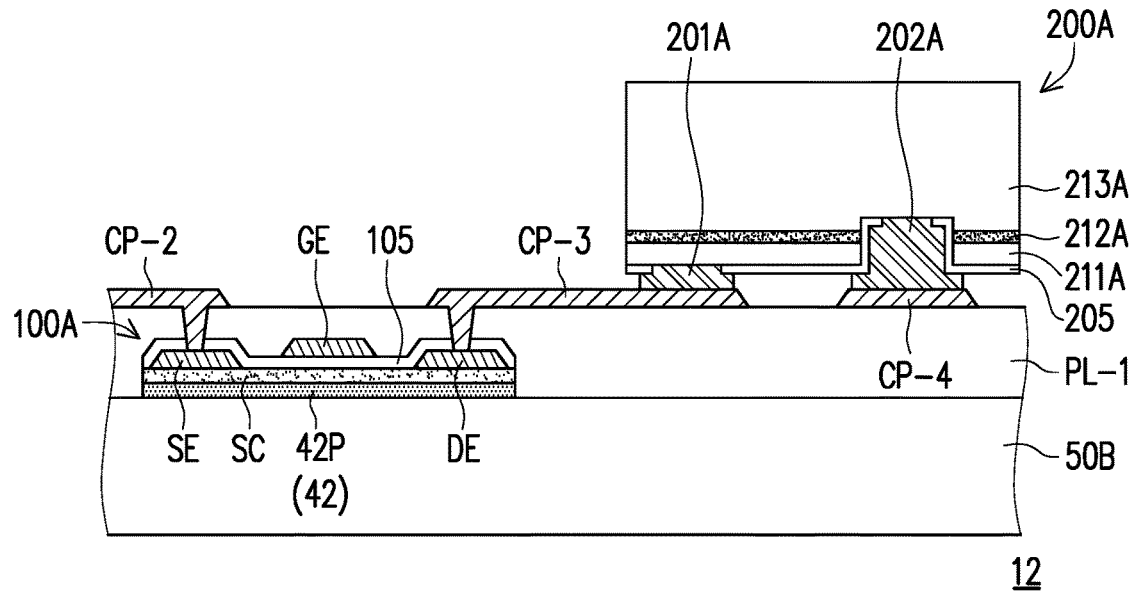
FIG. 5 is a cross-sectional view of a micro LED panel according to still another embodiment of the disclosure.

FIG. 5 is a cross-sectional view of a micro LED panel according to still another embodiment of the disclosure. With reference to FIG. 5, a difference between a micro LED panel 12 of this embodiment and the micro LED panel 11 of FIG. 4 includes the arrangement of the transistor devices. In this embodiment, a plurality of transistor devices 100A are directly transferred from a carrier onto a circuit substrate 50B. As such, an insulation patterns 42P of the transistor devices 100A adheres to the circuit substrate 50B; and the source electrode SE, the drain electrode DE, and the gate electrode GE are disposed at one side of a semiconductor pattern SC away from the circuit substrate 50B. Moreover, the transistor device 100A of this embodiment does not include any bumps to connect the circuit substrate 50B.

In the following process, a planarization layer PL-1 is formed on the transistor devices 100A and the circuit substrate 50B, and multiple through holes are formed in the planarization layer PL-1. Next, a plurality of conductive patterns are formed on the planarization layer PL-1, e.g., a conductive pattern CP-2, a conductive pattern CP-3, and a conductive pattern CP-4. The conductive pattern CP-2 and the conductive pattern CP-3 are electrically connected to the source electrode SE and the drain electrode DE of the corresponding transistor device 100A respectively through the through holes. And then, the micro LED devices 200A are bonded on the conductive patterns by mass transfer process. A first electrode 201A and a second electrode 202A of the micro LED device 200A are respectively bonded to the conductive pattern CP-3 and the conductive pattern CP-4. In particular, the gate electrode GE of the transistor device 100A may also be electrically connected to the circuit substrate 50B through another conductive pattern (not shown), and the conductive pattern CP-2 is also electrically connected to the circuit substrate 50B by a RDL (re-distribution layer) design, but the disclosure is not limited thereto.

In view of the foregoing, in the micro LED panel and the method of fabricating the same provided in an embodiment of the disclosure, the plurality of transistor devices preformed on the carrier are transferred and bonded to the circuit substrate through the transfer process, and in this way, production costs are reduced, and better production yield is provided. In another aspect, since the electron mobility of the semiconductor material layer of the semiconductor material substrate is high, the micro LED panel exhibits favorable operating electrical properties.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of fabricating a micro light emitting diode panel, comprising:
    forming a semiconductor material substrate, wherein the semiconductor material substrate comprises a carrier, a release layer, an inorganic insulation layer, and a semiconductor material layer, the release layer is located between the carrier and the inorganic insulation layer, the semiconductor material layer is bonded to the release layer through the inorganic insulation layer, and electron mobility of the semiconductor material layer is greater than 20 $cm^2/V \cdot s$;
    forming a plurality of transistor devices, wherein the transistor devices are disposed on the release layer;
    transferring and bonding the transistor devices onto a circuit substrate, wherein the transistor devices are electrically connected to the circuit substrate; and
    transferring and bonding a plurality of micro light emitting diode devices onto the circuit substrate, wherein the micro light emitting diode devices are electrically connected to the transistor devices.

2. The method of fabricating a micro light emitting diode panel as claimed in claim 1, wherein the step of transferring the transistor devices further comprises:
    transferring the transistor devices onto a temporary substrate; and
    transferring and bonding the transistor devices onto the circuit substrate from the temporary substrate.

3. The method of fabricating a micro light emitting diode panel as claimed in claim 1, wherein the step of transferring the transistor devices further comprises:
    removing the release layer to separate the transistor devices from the carrier.

4. The method of fabricating a micro light emitting diode panel as claimed in claim 1, wherein the step of forming the transistor devices comprises:
    removing a portion of the semiconductor material layer to form a plurality of semiconductor patterns.

5. The method of fabricating a micro light emitting diode panel as claimed in claim 4, wherein the step of forming the transistor devices further comprises:
    forming a source electrode, a drain electrode, a gate insulation layer, and a gate electrode on each semiconductor pattern, wherein the source electrode and the drain electrode are electrically connected to two different regions of the semiconductor pattern respectively, and the gate insulation layer covers the source electrode, the drain electrode, and a portion of the semiconductor pattern.

6. The method of fabricating a micro light emitting diode panel as claimed in claim 5, wherein the source electrode, the drain electrode, and the gate electrode are located between the semiconductor pattern and the circuit substrate after the transistor device is bonded to the circuit substrate.

7. The method of fabricating a micro light emitting diode panel as claimed in claim 5, wherein the step of forming the transistor device further comprises:
    forming a first bump and a second bump, wherein the first bump and the second bump are electrically connected to the source electrode and the drain electrode respectively, and the transistor device is bonded onto the circuit substrate through the first bump, the second bump.

8. The method of fabricating a micro light emitting diode panel as claimed in claim 7, wherein the first bump, the second bump, and the gate electrode are formed by patterning a same film layer.

9. The method of fabricating a micro light emitting diode panel as claimed in claim 1, further comprising:
    forming a planarization layer to cover the transistor device and the micro light emitting diode device; and
    forming a conductive layer on the planarization layer, wherein the planarization layer has an opening exposing a top surface of the micro light emitting diode device, and the conductive layer is electrically connected to the micro light emitting diode device through the opening.

10. The method of fabricating a micro light emitting diode panel as claimed in claim 1, further comprising:
forming a plurality of conductive patterns on the circuit substrate after the transistor devices are transferred to the circuit substrate, wherein a part of the conductive patterns are electrically connected to the transistor devices respectively, and the micro light emitting diode devices are bonded and electrically connected to another part of the conductive patterns respectively.

11. The method of fabricating a micro light emitting diode panel as claimed in claim 1, wherein the step of forming the transistor device comprises:
removing a portion of the inorganic insulation layer to form an insulation pattern, wherein the insulation pattern overlaps the transistor device.

12. The method of fabricating a micro light emitting diode panel as claimed in claim 11, wherein the transistor device is located between the circuit substrate and the insulation pattern after the transistor device is transferred and bonded to the circuit substrate.

\* \* \* \* \*